(12) United States Patent
Belaygue et al.

(10) Patent No.: US 12,031,447 B2
(45) Date of Patent: Jul. 9, 2024

(54) METHOD FOR MANUFACTURING A TURBINE ENGINE VANE AND TURBINE ENGINE VANE

(71) Applicant: SAFRAN HELICOPTER ENGINES, Bordes (FR)

(72) Inventors: Philippe Gabriel Louis Belaygue, Moissy-Cramayel (FR); Baptiste Romain Larrouy, Moissy-Cramayel (FR); Olivier Philippe David Berteaux, Moissy-Cramayel (FR)

(73) Assignee: SAFRAN HELICOPTER ENGINES, Bordes (FR)

( * ) Notice: Subject to any disclaimer, the term of this patent is extended or adjusted under 35 U.S.C. 154(b) by 0 days.

(21) Appl. No.: 17/757,936

(22) PCT Filed: Dec. 15, 2020

(86) PCT No.: PCT/FR2020/052459
§ 371 (c)(1),
(2) Date: Jul. 27, 2022

(87) PCT Pub. No.: WO2021/130433
PCT Pub. Date: Jul. 1, 2021

(65) Prior Publication Data
US 2023/0018317 A1    Jan. 19, 2023

(30) Foreign Application Priority Data
Dec. 23, 2019    (FR) ..................... 19 15444

(51) Int. Cl.
*F01D 25/00* (2006.01)
*B22D 27/04* (2006.01)
(Continued)

(52) U.S. Cl.
CPC ......... *F01D 25/005* (2013.01); *B22D 27/045* (2013.01); *B22F 10/28* (2021.01);
(Continued)

(58) Field of Classification Search
CPC ... F01D 25/005; B22D 27/045; B22D 21/025; B22D 19/16
See application file for complete search history.

(56) References Cited

U.S. PATENT DOCUMENTS

| 4,475,980 A | 10/1984 | Rhemer et al. |
| 5,551,999 A * | 9/1996 | Gostic ................ C21D 1/785 |
| | | 148/675 |

(Continued)

FOREIGN PATENT DOCUMENTS

| EP | 2 942 424 A2 | 11/2015 |
| EP | 2 942 424 A3 | 11/2015 |
| FR | 3 077 224 A1 | 8/2019 |

OTHER PUBLICATIONS

International Search Report issued Feb. 22, 2021 in PCT/FR2020/052459 filed Dec. 15, 2020, 2 pages.
(Continued)

*Primary Examiner* — Eldon T Brockman
(74) *Attorney, Agent, or Firm* — Oblon, McClelland, Maier & Neustadt, L.L.P.

(57) ABSTRACT

A method for manufacturing a blade with a first portion and a second portion, the method includes forming the first portion that includes forming a model of the first portion from removable material, forming a first shell mould from the model of the first portion, and forming the single-crystal or columnar first portion m a first metal alloy in the first shell mould from a single-crystal seed, and forming the second portion in which the second portion is formed on the first portion, and in which the first portion and the second portion are made from different materials, the second portion being
(Continued)

polycrystalline and formed from a second metal alloy. The blade includes a single-crystal or columnar first portion made from a first metal alloy and a polycrystalline second portion made from the second metal alloy different from the first metal alloy.

14 Claims, 3 Drawing Sheets

(51) Int. Cl.
*B22F 10/28* (2021.01)
*B22F 10/66* (2021.01)
*B33Y 10/00* (2015.01)
*B33Y 40/20* (2020.01)
*B33Y 80/00* (2015.01)
*C30B 29/52* (2006.01)
*F01D 9/02* (2006.01)

(52) U.S. Cl.
CPC .............. *B22F 10/66* (2021.01); *B33Y 10/00* (2014.12); *B33Y 40/20* (2020.01); *B33Y 80/00* (2014.12); *C30B 29/52* (2013.01); *F01D 9/02* (2013.01); *B22F 2301/15* (2013.01); *F05D 2220/32* (2013.01); *F05D 2230/20* (2013.01)

(56) References Cited

U.S. PATENT DOCUMENTS

| | | | |
|---|---|---|---|
| 10,221,468 B2 * | 3/2019 | Dial | B33Y 10/00 |
| 10,239,120 B2 * | 3/2019 | Cui | F01D 5/147 |
| 2014/0037981 A1 * | 2/2014 | Cui | C30B 28/06 428/615 |
| 2014/0099209 A1 * | 4/2014 | Ahmad | B22D 27/045 164/122.2 |
| 2015/0321250 A1 * | 11/2015 | Xu | B33Y 40/20 228/119 |
| 2016/0332266 A1 | 11/2016 | Xu | |
| 2017/0008081 A1 * | 1/2017 | Cui | F01D 5/28 |
| 2017/0144219 A1 | 5/2017 | Xu | |
| 2018/0002785 A1 * | 1/2018 | Dial | C22C 19/056 |

OTHER PUBLICATIONS

Preliminary French Search Report issued May 13, 2020 in French Patent Application No. 1915444, 9 pages (with Translation of Category of Documents).

* cited by examiner

[Fig. 1]
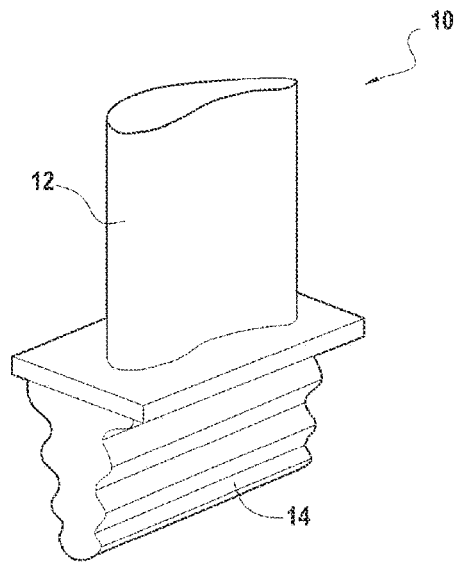
[Fig. 2]
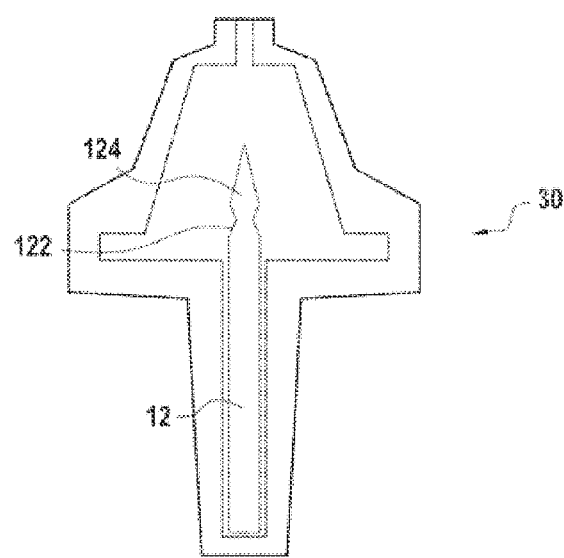

[Fig. 3]
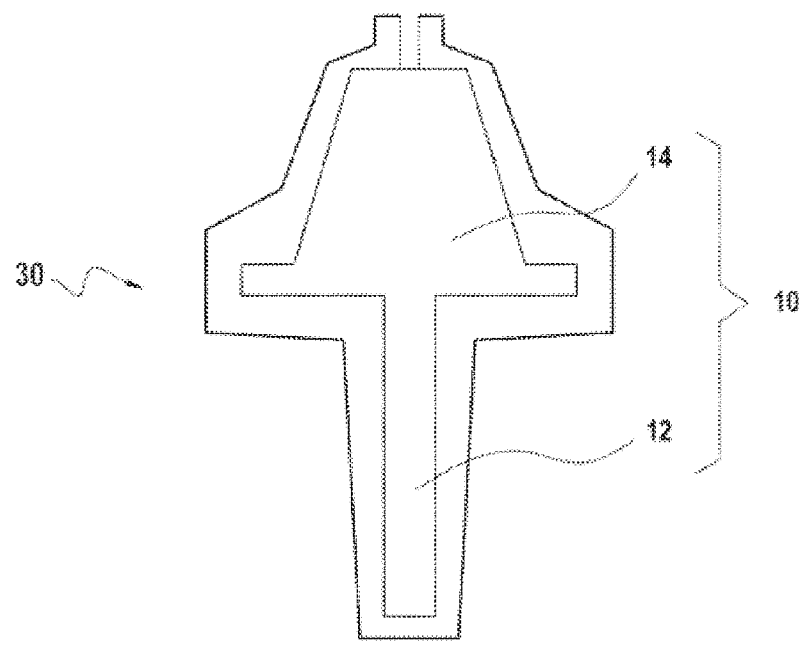

[Fig. 4]
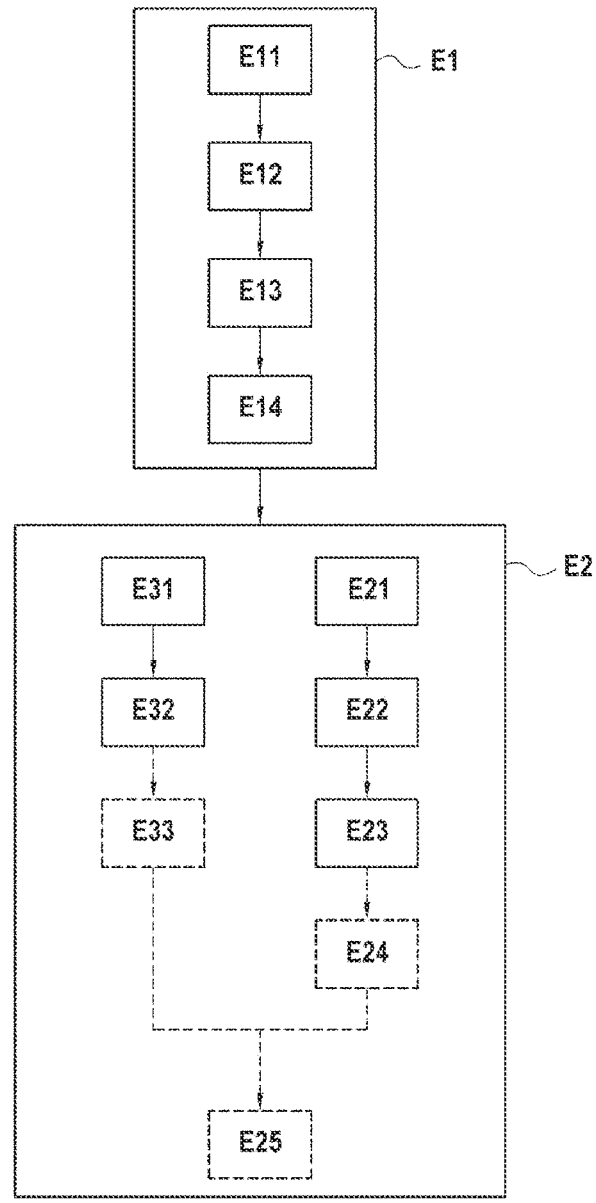

METHOD FOR MANUFACTURING A TURBINE ENGINE VANE AND TURBINE ENGINE VANE

TECHNICAL FIELD

The present disclosure relates to the manufacture of blades for compressors or for turbine-engine turbines. The present disclosure relates in particular to the manufacture of high-pressure turbine blades.

PRIOR ART

Methods are known for manufacturing single-crystal high-pressure turbine blades by lost-wax casting.

These methods comprise the forming of a blade model in wax or resin, then forming a ceramic shell mould around this blade model by successive soaking and drying. The wax or resin is then removed during a dewaxing step, and then the shell mould is sintered, ultimately leaving the hollow shell mould. A single-crystal seed is placed in the shell mould and liquid metal is poured into the shell mould. The shell mould gradually descends out of the hot chamber in which it is located, which leads to the directed solidification of the liquid metal starting from the single-crystal seed. In this way, a single-crystal blade is formed.

The choice of material is an important criterion for ensuring good performance. More specifically, a single-crystal blade must respond to specific creep stresses, while remaining as light as possible. The creep stresses include mechanical stresses and temperature stresses which are imposed on the blade disposed in a turbine engine in operation and which the material must withstand. Furthermore, cost optimisation is also an issue affecting the choice of material.

More particularly, the single-crystal blades obtained by earlier methods only enable the manufacture of one-piece and single-material blades. In general, the blades comprise an aerofoil and a root. The properties of the material are therefore imposed by the strictest conditions to which the completed blade disposed in the turbine engine in operation is subjected. For example, the stresses to which the aerofoil of a turbine engine blade in operation is subjected are larger than the stresses to which the blade root is subjected. The material which composes the aerofoil, and therefore the blade, must therefore comply with constraining specifications responding to these stresses, which generally makes it more expensive and/or heavier than a material which needs to respond to less significant stresses.

Consequently, there is an equilibrium to be found between performance of the material and the cost of the blade. Alloys have been developed with the aim of optimising the specifications for single-crystal blades, but there still remains a margin for improvement.

More particularly, there is a need to improve the method for manufacturing blades.

Furthermore, it is noted that the present disclosure concerns both fixed and moving blades.

DISCLOSURE OF THE INVENTION

The present disclosure relates to a method for manufacturing a blade comprising a first portion and a second portion, the method comprising a step of forming the first portion that comprises forming a model of the first portion from removable material, then forming a first shell mould from the model of the first portion, then forming the single-crystal or columnar first portion from a first metal alloy in the first shell mould from a grain selector, a step of forming the second portion in which a second portion is formed on the first portion, and in which the first portion and the second portion are made from different materials, the second portion being polycrystalline and formed from a second metal alloy.

It is understood that the polycrystalline portion is not a portion for which the growth is directed (single-crystal or columnar). The polycrystalline portions can therefore comprise a plurality of grains randomly directed in all directions.

In the present disclosure, a non-limiting example can include removable wax or resin material.

In certain embodiments, the first portion is an aerofoil and the second portion is a root.

In a turbine engine in operation, the root and the aerofoil of a blade are not subject to the same stresses. By choosing the aerofoil as first portion and the blade root as second portion, it is possible to provide separate specifications for the materials making up these two portions, each specifically adapted to the environment to which the aerofoil or the root is subjected, respectively.

Such a method makes it possible to design a turbine engine blade with a root and an aerofoil made of different optimised materials. It is therefore possible to respond to a demanding specification, in particular for the creep properties of the material which makes up the aerofoil, while using a material responding to the less demanding specifications for forming the root. More particularly, as opposed to the single-crystal blades or the blades with columnar structure known in the art, obtaining blades which are partially polycrystalline is quicker and much less expensive.

It is therefore possible, using this method, to optimise both the creep properties and the cost of a single-crystal/columnar blade without interfering with its performance or even reducing its weight. More particularly, it is possible to independently optimise the material which makes up the aerofoil of the blade and the material which makes up the root of the blade, knowing that these two elements are not going to be subjected to the same stresses once the blade is disposed in a turbine engine in operation.

Furthermore, this method makes it possible to manufacture a blade comprising the envisaged portions from different materials, without requiring welding, bonding or more generally an assembly step. The method is simpler and faster, but above all more efficient, in particular in terms of the strength of the connection between the two materials, due in particular to diffusion phenomena.

Moreover, in the known methods, it is necessary that the blade is entirely single-crystal/columnar for reasons of the final strength of the blade. In particular, in a single-crystal/columnar blade, the presence of polycrystalline grains, for example equiaxed, in the aerofoil of the blade could weaken the blade by creating interfaces, referred to as grain boundaries, where cracks can propagate easily and therefore cause a risk of failure of the blade. However, this risk substantially concerns the aerofoil, which is subject to the largest stresses. The present method overcomes this risk by separating the blade into two portions.

In certain embodiments, the first portion and the second portion are formed from two different nickel-based alloys.

In the present disclosure, a nickel-based alloy is an alloy for which the nickel is the element having the largest mass fraction, preferably greater than 40%.

In this configuration, it is possible to provide two materials with different properties, one making up the aerofoil and the other the root, each being optimised according to the environment and stresses to which it is subjected in a turbine engine in operation. The use of an alloy with the same nickel base for the first and second portion makes it possible, furthermore, to ensure a good metallic bond (perfect epitaxy) between these two portions.

In certain embodiments, the method comprises at least one treatment step after the step of forming the second portion.

This treatment step can optimise the mechanical properties of the materials making up the turbine engine blade.

In certain non-limiting examples, the polycrystalline alloy forming the second portion has a solvus temperature $T_{\gamma'}$ corresponding to the solvus temperature of the precipitates $\gamma'$ in the alloy. The treatment step can then comprise two heat treatment steps, the first step taking place at a temperature between 95% and 105% of the solvus temperature $T_{\gamma'}$ and the second step taking place at a temperature between 65% and 75% of the solvus temperature $T_{\gamma'}$.

In the configuration of the preceding examples, during the first heat treatment step, the single-crystal first portion undergoes an ageing treatment while the second polycrystalline portion undergoes a solution treatment. Hence, these two treatments are carried out in a single first heat treatment step, which represents a saving in time and resources.

Moreover, during the second treatment step, the first single-crystal portion undergoes a second ageing treatment and the second polycrystalline portion undergoes an ageing treatment. In the same way as with the first heat treatment step, these two treatments are operated in a single second heat treatment step. This therefore represents a saving in time and resources.

In certain embodiments, the step of forming the second portion comprises the forming of the second portion from the second metal alloy on the first portion by a powder bed fusion method.

In this configuration, it is possible to provide the blade root using a method independent from the method for forming the aerofoil, while adding it directly on the aerofoil. This operation is less expensive and quicker than a casting step. As a method of powder bed fusion, it is possible to cite, for example, the powder bed fusion method referred to as SLM (abbreviation for Selective Laser Melting).

This method is a method during which a three-dimensional part is produced, layer by layer, by at least partially locally melting one more layers of powder by a laser which scans the layer of powder at the locations where it is desired to melt the powder. When a layer has been scanned by the laser, a new layer of powder is deposited on the layer which has just been scanned and the new layer is scanned by the laser. The part is thus constructed, layer by layer.

This method saves in terms of costs and manufacturing time, while guaranteeing mechanical properties that can approach those obtained with the traditional methods, such as forging, or those of the foundry.

Indeed, powder bed fusion manufacturing can overcome the need to manufacture moulds and/or to weld and/or to assemble various elements in order to form the desired part. It is therefore simpler to pass from the design step to the production step of the part.

In certain embodiments, the method comprises a step of junction machining after the step of forming the second portion.

Hence, it is possible to adjust the root, or even the profile of the blade, and to correct possible imperfections generated by the method of powder bed fusion.

In certain embodiments, the step of forming the second portion comprises the forming of a model of the second portion made of removable material, then forming a second shell mould on the basis of the second portion model, then forming the second portion from the second metal alloy in the second shell mould.

This configuration provides an alternative to the independent forming of a blade root and an aerofoil.

In certain embodiments, the step of forming the second portion comprises an equiaxed cooling step.

Hence, the cooling step is quick and leads to the forming of a polycrystalline root. This step thus represents a time saving compared to a directed cooling step that is required in the known protocols for forming single-crystal/columnar blades.

In certain embodiments, the junction portion of the first portion is remelted during the step of forming the second portion.

In this configuration, the metallurgical bond between the first portion and the second portion is improved.

Furthermore, the present disclosure relates to a blade comprising a single-crystal or columnar first portion made from a first metal alloy and a polycrystalline second portion made from a second metal alloy different from the first metal alloy.

Such a blade has the above mentioned advantages.

In certain embodiments, the blade is obtained by one of the previously described methods.

In certain embodiments, the second portion and the first portion of the blade are formed from two different nickel-based alloys.

BRIEF DESCRIPTION OF THE FIGURES

The invention and its advantages will be better understood on reading the following detailed description of various embodiments on the invention presented by way of non-limiting examples. This description refers to the attached pages of figures, in which:

FIG. 1 shows a single-crystal or columnar blade obtained by a method according to an embodiment.

FIG. 2 shows a single-crystal or columnar aerofoil obtained by a method according to an embodiment, placed on a second shell mould.

FIG. 3 shows a second shell mould according to a second embodiment of the method, formed around a blade.

FIG. 4 schematically shows the steps of the method according to the various embodiments.

DESCRIPTION OF THE EMBODIMENTS

FIG. 1 shows a blade 10 comprising an aerofoil 12 and a root 14. The aerofoil 12 and the root 14 are formed of different metal alloys. By way of non-limiting example, the aerofoil 12 and the root 14 are formed of nickel-based alloys. In particular, the root 14 can be polycrystalline and made of a less expensive and/or lighter alloy than the alloy of the aerofoil 12. In the case where the root is polycrystalline, it can have a solvus temperature $T_{\gamma'}$ corresponding to the solvus temperature of precipitates $\gamma'$ in the alloy which composes the root 14.

In the described embodiments, a first portion corresponds to the aerofoil 12 and a second portion corresponds to the root 14. However, it is possible to subdivide the blade in another way, with a first portion and a second portion which do not necessarily correspond to the aerofoil 12 and the root 14. In particular, the thermomechanical load level of the aerofoil to be formed, as well as the associated manufacturing method, determine the position of the junction.

Furthermore, the blade 10 can comprise a platform which corresponds to a planar portion extending at the level of the contact between the root 14 and the aerofoil 12. Hence, it is possible to include the platform in the first portion or in the second portion, as needed. It is also possible to provide one portion of the platform on the first portion of the blade 10 and a second portion of the platform on the second portion of the blade 10.

This blade 10 is obtained by a method as shown schematically in the diagram of FIG. 4, comprising an aerofoil-forming step (or step of forming the first portion) E1, wherein the single-crystal aerofoil 12 is formed following a step E2 of forming the second portion, in which the root 14 is formed.

The aerofoil forming step E1 comprises a step E11 of forming an aerofoil model from removable material, followed by a step E12 of forming a first shell mould, wherein a first shell mould is formed using the aerofoil model formed during step E11 by successive soaking and drying, then the first shell mould is dewaxed and sintered. The aerofoil forming step E1 then comprises a casting step E13 in which a grain selector is disposed in the first shell mould and the liquid metal, intended to form the first metal alloy, is poured into the first shell mould then disposed in a hot chamber. Finally, the aerofoil forming step E1 comprises a directed solidification step E14 carried out in the hot chamber, in which the first shell mould is slowly withdrawn from the hot chamber in order to form the single-crystal aerofoil 12 starting from the grain selector.

In certain configurations, the aerofoil 12 is formed in a columnar manner. In this configuration, the aerofoil 12 is composed of grains, the crystallisation of which is directed in a preferential direction, based on the preferential direction of the grains of the grain selector.

In known manner, the aerofoil 12 can undergo a heat treatment for homogenisation of the chemistry between dendrite and interdendrites. This also enables control of the distribution of precipitates in the aerofoil 12. For example, the aerofoil 12 can undergo a heat treatment at a temperature between 110% and 115% of the solvus temperature $T_y$. In the present example, this range corresponds to the range 1260° C. to 1330° C.

This aerofoil forming method E1, making it possible to form the aerofoil 12, is common and prior to the following two embodiments of the step E2 forming the second portion. Moreover, in the following embodiments, by way of non-limiting example, the material used for forming the aerofoil 12 is the nickel-based alloy CMSX4®.

Forming of the Root by a Powder-Bed Additive Method

In a first embodiment, the root 14 is formed by addition on the aerofoil 12. With reference to the left-hand side of FIG. 4, the root 14 is formed during a step E2 of forming the second portion, commencing with a root forming step E31. The root 14 is formed on the single-crystal aerofoil 12 using a selective laser melting (SLM) method. During this step, the root 14 is formed layer by layer from the metal powder bed, into which the aerofoil 12 is plunged. The laser selectively melts the powder grains by scanning the bed along the profile of the root 14, thus forming the root 14 when the grains melt and then solidify. The root 14 formed in this way is polycrystalline.

Then, the formed root 14 undergoes a hot isostatic compression step E32. This step increases the density of the root 14 which has been formed. In the present example, the hot isostatic compression is carried out at between 1130° C. and 1190° C. and followed by slow cooling to 1050° C. and 1100° C.

Then, the formed blade 10 can be machined during a machining step E33. During this step, the conformation and the state of the surface of the root E31 are adjusted. The blade 10 is then brought into conformity with the desired profile. In particular, the root and/or the junction can be machined.

In this embodiment, by way of non-limiting example, the material used to form the root 14 is the nickel-based alloy René® 77.

In this embodiment, the aerofoil 12 can comprise a part of the platform of the blade 10, while the root comprises the other part of the platform of the blade 10. Furthermore, it is possible to separate the first portion and the second portion above and below the platform. The junction between the first portion and the second portion can therefore be situated in the aerofoil or the root.

In order to obtain a desired surface state, a foundry step can be provided after the step E2 of forming the second portion. This step consists of a partial re-melting of the root 14, in a mould. This additional step has the advantage of improving the surface state of the root 14 by homogenising potential surface irregularities caused by the successive passages of the laser (in particular the so-called downskin areas, which are areas having no solid material as support during their formation). It also makes it possible to produce the additive manufacturing area with a less fine and less focused laser, which therefore reduces production times.

Formation of the Root by a Lost-Wax Casting Method

In a second embodiment, the root 14 is formed by a lost-wax foundry method. With reference to the right-hand side of FIG. 4, the step E2 of forming the second portion comprises a step E21 of forming a blade model made of removable material, wherein a root model is formed on the aerofoil 12 formed during the aerofoil forming step E1. The root model made of removable material and the aerofoil 12 therefore form a blade model. The blade model forming step E21 is followed by a step E22 of forming a second shell mould, in which a second shell mould 30 is formed using the blade model by successive soaking and drying, then the second shell mould 30 is dewaxed and sintered.

In this embodiment, the aerofoil 12 is held in place in the second shell mould 30 during these steps. The root forming step E2 then comprises a blade casting step E23, in particular of the blade root 14, in which the liquid metal, intended to form the second metal alloy, is poured into the second shell mould 30 then placed in a hot chamber. Finally, the aerofoil forming step E2 comprises an equiaxed solidification step E24 of the root 14, carried out in the hot chamber, in which the second shell mould 30 is rapidly withdrawn from the hot chamber in order to form the blade 10 starting from the single-crystal aerofoil 12 and the polycrystalline root 14.

FIG. 2 shows the blade model obtained after the blade model forming step E21 according to an embodiment. As shown in FIG. 2, the aerofoil 12 formed during the forming step E1 comprises an attachment portion 122 and a conical end portion 124. The conical end portion 124 is provided at the end of the aerofoil 12 which is brought into contact with the root 14 to be formed.

The conical end portion 124 is the portion of the aerofoil 12 which is remelted during the blade casting step E23. This ensures an almost-perfect epitaxy between the aerofoil 12 and the root 14. Indeed, during the blade casting step E23, only the upper portion of the second shell mould 30 is disposed in the hot chamber, in other words the portion corresponding to the root 14.

The attachment portion 122 is configured so that the root model formed during the blade model forming step E21 can be positioned precisely around the aerofoil 12 and in order to ensure a good attachment between the root model and the aerofoil 12.

FIG. 3 shows the blade 10 obtained after the equiaxed solidification step E24 of the root 14 on the aerofoil 12. In the second shell mould 30, the blade 10 therefore has two portions: the single-crystal aerofoil 12 and the polycrystalline root 14. The conical end portion 124 of the aerofoil 12 has been re-melted with the root 14.

In this embodiment, by way of non-limiting example, the material used to form the root 14 is the nickel-based alloy Inconel® 792.

In this embodiment, the root 14 may comprise the entirety of the platform of the blade 10.

Optionally, the finalised blade 10 obtained by one of the previously described embodiments can undergo a treatment step E25. This treatment can comprise a heat treatment and/or the depositing of additional layers. It can be added to the heat treatment for homogenisation of the aerofoil 12.

In the first and the second embodiment, the treatment step E25 can comprise firstly a step of depositing an anti-oxidation layer. In the present case, by way of non-limiting example, this layer is a layer of NiCoCrAlYTa, which is deposited at least on the aerofoil 12 of the blade 10.

Then, in a first heat treatment step, the blade 10 undergoes a heat treatment in which the blade 10 is heated to between 1080° C. and 1100° C. for 4 hours, then cooled with air. This treatment allows diffusion of the anti-oxidation layer into the materials making up the blade 10. In the case where the blade comprises Inconel® 792, this treatment can also allow its solution treatment.

More generally, in this first heat treatment step, the temperature to which the blade 10 is heated is between 95% and 105% of the soles temperature $T_{\gamma'}$. In the present example, this range corresponds to the range between 1080° C. and 1180° C. During this step, the single-crystal aerofoil 12 undergoes an ageing treatment while the polycrystalline root 14 undergoes a solution treatment. Hence, these two treatments are carried out in a single first heat treatment step, which represents a saving in time and resources.

Then, in a second heat treatment step, the blade 10 can undergo a treatment between 840° C. and 870° C. for 20 to 24 hours, followed by cooling with air. This step enables the ageing of the materials which make up the blade 10.

More generally, during the second heat treatment step, the blade 10 is heated to a temperature between 65% and 75% of the solvus temperature $T_{\gamma'}$. In the present example, this range corresponds to the range between 750° C. and 880° C. During this step, the aerofoil 12 undergoes a second ageing treatment and the polycrystalline root 14 undergoes an ageing treatment. In the same way as with the first heat treatment step, these two treatments are operated in a single second heat treatment step. This therefore represents a saving in time and resources.

Furthermore, the treatment step E25 can comprise the depositing of an abrasive coating on the head of the blade, at the distal end of the aerofoil 12. The distal end means the end of the aerofoil 12 which is not in contact with the root 14. In this example, the abrasive coating is a zirconia deposit.

Although the present invention has been described by referring to specific exemplary embodiments, it is obvious that modifications and changes can be made to these examples without going beyond the general scope of the invention as defined by the claims. In particular, the individual features of the various embodiments illustrated/mentioned can be combined in additional embodiments, and the materials can be modified as well as their treatment. Typically, the polycrystalline portion can be produced by powder metrology, or any other manufacturing method. Consequently, the description and the drawings should be considered as illustrating rather than limiting.

It is also obvious that all the features described in reference to a method can be transposed, alone or in combination, to a device, and inversely, all the features described in reference to a device can be transposed, alone or in combination, to a method.

The invention claimed is:

1. A method for manufacturing a blade comprising a first portion and a second portion, the method comprising:
   forming the first portion, comprising
      forming a model of the first portion from removable material,
      forming a first shell mould from the model of the first portion, and
      forming a single-crystal or columnar first portion from a first metal alloy in the first shell mould from a grain selector; and
   forming the second portion in which the second portion is formed on the first portion, wherein the first portion and the second portion are made from different materials, the second portion being polycrystalline and formed from a second metal alloy.

2. The method according to claim 1, wherein the first portion is an aerofoil and the second portion is a root.

3. The method according to claim 1, wherein the first portion and the second portion are formed from two different nickel-based alloys.

4. The method according to claim 1, further comprising at least one treatment after the forming of the second portion.

5. The method according to claim 4, wherein the treatment comprises
   a first heat treatment, in which the blade is heated to a temperature between 95% and 105% of a solvus temperature of the second polycrystalline portion, and
   a second heat treatment in which the blade is heated to a temperature between 65% and 75% of the solvus temperature.

6. The method according to claim 1, wherein the forming of the second portion comprises the forming of the second portion from the second metal alloy on the first portion by a powder bed fusion method.

7. The method according to claim 6, further comprising junction machining after the forming of the second portion.

8. The method according to claim 1, wherein the forming of the second portion comprises
   forming a model of the second portion made of removable material,
   forming a second shell mould on a basis of the second portion model, and
   forming the second portion from the second metal alloy in the second shell mould.

9. The method according to claim 8, wherein the forming of the second portion comprises equiaxed cooling.

10. The method according to claim 8, wherein a junction portion of the first portion is remelted during the forming of the second portion.

11. A blade, comprising:
   a single-crystal first portion made from a first metal alloy; and
   a polycrystalline second portion made from a second metal alloy different from the first metal alloy.

12. The blade according to claim 11, wherein the blade is obtained by a method comprising:
  forming the first portion, comprising
    forming a model of the first portion from removable material,
    forming a first shell mould from the model of the first portion, and
    forming the single-crystal first portion from a first metal alloy in the first shell mould from a grain selector; and
  forming the second portion in which the second portion is formed on the first portion, wherein the first portion and the second portion are made from different materials, the second portion being polycrystalline and formed from a second metal alloy.

13. The blade according to claim 11, wherein the first portion and the second portion are formed from two different nickel-based alloys.

14. The blade according to claim 11, wherein the first portion is an aerofoil and the second portion is a root.

\* \* \* \* \*